(12) United States Patent
Choy et al.

(10) Patent No.: US 7,724,603 B2
(45) Date of Patent: May 25, 2010

(54) METHOD AND CIRCUIT FOR PREVENTING HIGH VOLTAGE MEMORY DISTURB

(75) Inventors: Jon S. Choy, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 133 days.

(21) Appl. No.: 11/833,545

(22) Filed: Aug. 3, 2007

(65) Prior Publication Data

US 2009/0034352 A1 Feb. 5, 2009

(51) Int. Cl.
*G11C 5/14* (2006.01)
(52) U.S. Cl. ............. 365/226; 365/189.09; 365/189.11; 327/535; 327/536; 327/537
(58) Field of Classification Search .................. 365/226, 365/189.09, 189.11; 327/535, 536, 537
See application file for complete search history.

(56) References Cited

U.S. PATENT DOCUMENTS

| | | | |
|---|---|---|---|
| 5,267,218 A | 11/1993 | Elbert | |
| 5,278,785 A | 1/1994 | Hazani | |
| 5,301,151 A | 4/1994 | Wells et al. | |
| 5,345,422 A | 9/1994 | Redwine | |
| 5,781,473 A * | 7/1998 | Javanifard et al. | 365/185.18 |
| 6,498,761 B2 * | 12/2002 | Banba et al. | 365/226 |
| 2006/0133147 A1 * | 6/2006 | Lee et al. | 365/185.18 |
| 2007/0081391 A1 * | 4/2007 | Jeon et al. | 365/185.23 |
| 2007/0081392 A1 * | 4/2007 | Park et al. | 365/185.23 |
| 2008/0024198 A1 * | 1/2008 | Bitonti et al. | 327/536 |

OTHER PUBLICATIONS

PCT/US2008/068091 International Search Report and Written Opinion, Date: Oct. 16, 2008.

* cited by examiner

*Primary Examiner*—Pho M Luu
*Assistant Examiner*—Toan Le
(74) *Attorney, Agent, or Firm*—Robert L. King; James L. Clingan, Jr.

(57) ABSTRACT

A circuit and method reduces disturb in a memory array resulting from one of two supply voltages dropping below a predetermined value. Memory control logic is operated using a logic power domain. Higher voltages than that of the logic power domain are generated in response to an oscillator oscillating. The higher voltages are used to operate the memory array. Operation of the oscillator is controlled with the memory control logic when the logic power domain is at least at a first level or value. The oscillator is disabled when the logic power domain is below the first level. The disabling of the oscillator has the effect of preventing generation of the higher voltages. This facilitates preventing the higher voltages from reaching the memory array when they may not be properly controlled.

20 Claims, 4 Drawing Sheets

METHOD AND CIRCUIT FOR PREVENTING HIGH VOLTAGE MEMORY DISTURB

BACKGROUND

1. Field

This disclosure relates generally to semiconductors, and more specifically, to semiconductor data storage devices.

2. Related Art

Semiconductor memories that are embedded in an integrated circuit with other types of circuitry typically require two differing power supply voltages to operate. A first power supply voltage is used to power control circuitry for the memory. Such control circuitry frequently is implemented with logic gates and is powered with a supply voltage that is relatively low. A second power supply voltage is used to power memory operations such as programming or erasing the memory. Such voltages, especially for memories such as FLASH memory, are typically much larger in magnitude than the power required for logic circuitry. Should the low valued power supply voltage fall below a critical value required to power the logic circuitry, erroneous logic signals may be generated. With incorrect logic values the bit cells in the memory array may be incorrectly exposed to the high voltage power supply which is typically generated by charge pumps or voltage multipliers. Erroneous coupling of the high voltage to a memory cell will change the electrical characteristics of the memory cell. Erroneous data may result from the changed electrical characteristics thereby creating unreliable operation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
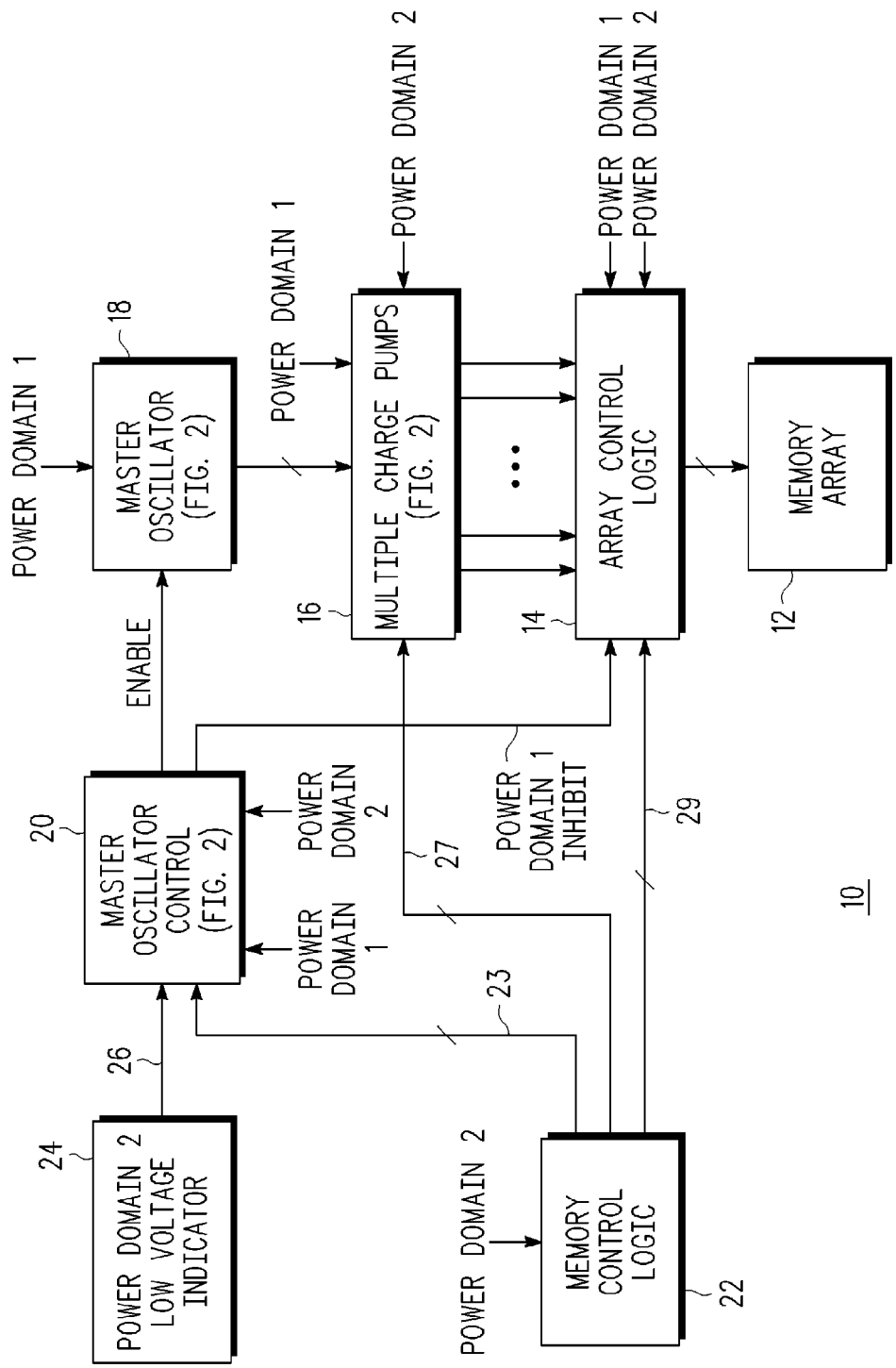
FIG. 1 illustrates in a block diagram form a memory for preventing high voltage memory disturb in accordance with the present invention.

Illustrated in FIG. 1 is a memory 10 having a voltage disturb protection scheme. The voltage disturb protection prevents the unintended coupling of a high voltage to memory bit cells of a memory array 12 which can alter the electrical characteristics of the memory array in an undesired manner. The memory array 12 has a plurality of memory bits that are controlled by an array control logic 14. The array control logic 14 operates under the power of two distinct power supply voltages. A first power supply voltage is designated as a Power Domain 1 or a Memory Power Domain. The Power Domain 1 is a supply voltage that is used by the multiple charge pumps to create a voltage that is sufficiently large in magnitude to be able to program and erase memory bits within the memory array 12. A second power supply voltage is designated as a Power Domain 2 and is a Logic Power Domain. The second power supply voltage is less than the first power supply voltage and has a magnitude that is higher than at least a transistor operation voltage to enable the powering of logic gates and logic circuitry. Therefore, neither the first power supply voltage nor the second power supply voltage is large enough in magnitude to program or erase memory bits. The array control logic 14 is powered by a plurality of multiple charge pumps 16. Each of the multiple charge pumps is implemented as a voltage multiplier circuit or a charge pump circuit. The Multiple charge pumps 16 operate with both the Power Domain 1 and Power Domain 2 power supply voltages. An input of the multiple charge pumps 16 is coupled to an output of a single master oscillator 18. The single master oscillator 18 is a shared, common oscillator used to clock all multiple charge pumps 16. The single master oscillator 18 operates with the Power Domain 1 memory power voltage and has an input coupled to an output of a master oscillator control 20. The master oscillator control 20 operates with the Power Domain 1 memory power voltage and the Power Domain 2 logic power voltage. A first input of the master oscillator control 20 is connected to an output of a power domain 2 low voltage indicator 24 for receiving a Low Voltage Indicator (LVI) signal 26. A second input of the master oscillator control 20 is connected to a first output of a memory control logic 22. The memory control logic 22 operates with the Power Domain 2 logic power voltage. A second output of the memory control logic 22 is connected to a control input of the multiple charge pumps 16 for providing a control signal 27. A third output of the memory control logic 22 is connected to a second control input of the array control logic 14 for providing a control signal 29 to the array control logic 14 for controlling the various interactions with the memory array 12. A second output of the master oscillator control 20 is connected to a second input of the array control logic 14.

In operation, the memory 10 functions to store data under control of the array control logic 14. For convenience of illustration, the data paths to memory array 12 are not shown but are conventional in structure and operation. The memory 10 operates using the Logic Power Domain (Power Domain 2) to power the illustrated logic circuitry at a logic voltage level that is only high enough to be able to reliably switch logic transistors. This voltage is process dependent and is currently in the one volt range or less. In contrast, the Memory Power Domain (Power Domain 1) is used to power specific memory operations, such as a program operation or an erase operation. Assume that the memory array 12, in one form, is implemented as a FLASH memory. In this form the voltage that is used to implement the Power Domain 1 is typically three volts or greater. This voltage is also process dependent and may become less in the future. In any event, the Power Domain 1 voltage is significantly greater than the Power Domain 2 voltage.

In many applications in which the memory 10 is implemented as a portable electronic device, portable batteries are used to supply the power for both the Power Domain 1 and Power Domain 2 supply voltages. Because the logic operations associated with the memory 10 are used much more frequently than the higher voltage memory operations, the battery that is used to power the Power Domain 2 voltage may be depleted before that used for Power Domain 1. The power domain 2 low voltage indicator 24 is used to indicate when the Power Domain 2 voltage falls below a predetermined minimum voltage value or level that is required to reliably power the logic circuitry. A Low Voltage Indicator signal 26 is asserted to the master oscillator control 20 when the Power Domain 2 voltage becomes too low. In response to the Low Voltage Indicator signal 26, the master oscillator control 20 will no longer assert the Enable signal previously provided to the single master oscillator 18. When the Low Voltage Indicator signal 26 is not asserted, the memory control logic 22 is operating at a proper voltage and is providing a control signal 23 to the master oscillator control 20. In this condition the memory 10 is functioning in normal circuit operation and is providing control information to the master oscillator control 20 for properly controlling the single master oscillator 18. The master oscillator 18 in turn generates clock signals with the proper timing to operate the multiple charge pumps 16 which selectively boost the Power Domain 1 signals. The memory control logic 22 provides the control signal 27 to control the coupling of the multiple charge pumps 16 to the array control logic 14. The multiple charge pumps 16 use the Power Domain 2 to power logic interface circuitry within the multiple charge pumps 16 for interfacing between the logic power domain used by the memory control logic 22 and the memory power domain used by the multiple charge pumps 16. The array control logic 14 receives the boosted voltages from the multiple charge pumps 16 and steers the boosted supply voltages to the correct locations within the memory array 12.

When the power domain 2 low voltage indicator 24 determines that the power domain 2 voltage is too low to reliably operate the logic circuitry within the memory control logic 22 and other logic circuitry of memory 10, the Low Voltage Indicator signal 26 is asserted. An assertion of the Low Voltage Indicator signal 26 disables the master oscillator control 20. As a result, the Enable signal to the master oscillator 18 is no longer asserted by the master oscillator control 20. Additionally, the master oscillator control 20 will no longer assert the Power Domain 1 Inhibit signal to the array control logic 14. In an alternative form the Enable signal also functions to completely power down the master oscillator 18 and further conserves power in memory 10. When the master oscillator 18 is again enabled and powered up, there is no synchronization issue associated with the memory operation. In either form the Enable signal that is provided by the master oscillator control 20 functions to control a clock signal output from the master oscillator 18. In response to the Power Domain 1 Inhibit signal, the array control logic 14 decouples the Power Domain 1 supply voltage from propagating to the nodes of the bit cells within memory array 12. It should be noted that the master oscillator control 20 therefore functions to prevent generation of multiple boosted voltages from the multiple charge pumps 16 when the Low Voltage indication signal is asserted. Further power savings are accomplished if generation of multiple charge pump voltages is avoided by directly controlling the single master oscillator 18.

Figure 2:
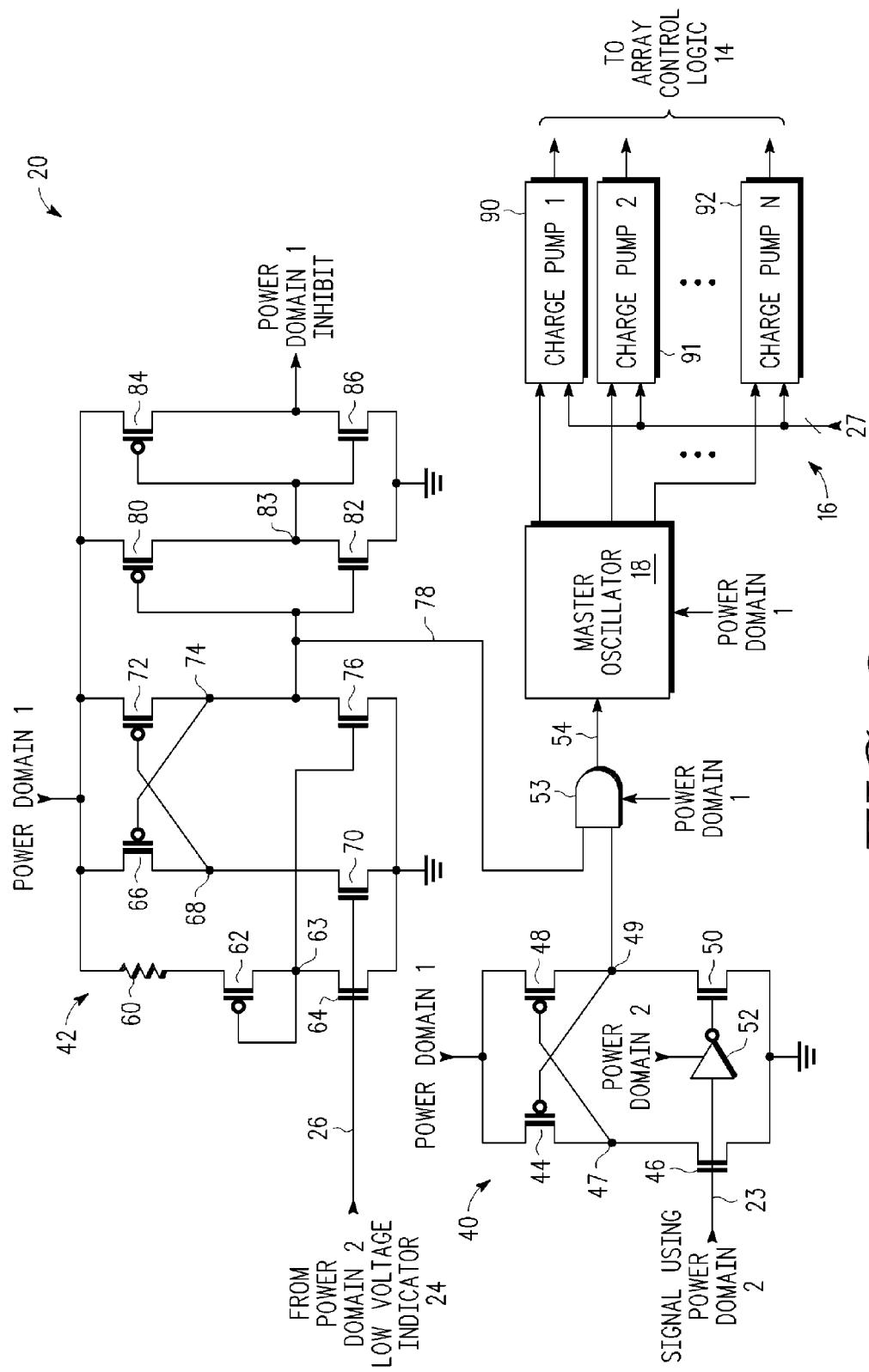
FIG. 2 illustrates in a partial schematic form one form of the master oscillator and its control as utilized in FIG. 1.

Illustrated in FIG. 2 is one form of the master oscillator control 20 in combination with the master oscillator 18 and the multiple charge pumps. The master oscillator control 20 is not illustrated in detail because any of numerous conventional oscillator circuits may be used. Further, no specific detail is provided for the charge pumps in FIG. 2 because any of numerous conventional charge pump circuits may be used. In the illustrated form the master oscillator control 20 has a level shifter circuit 40 and a level shifter circuit 42. Within the level shifter circuit 40 is a P-channel transistor 44 having a source connected to a terminal for receiving a supply voltage of the Power Domain 1 (the Memory Power Domain). A drain of transistor 44 is connected to a node 47 and to a drain of an N-channel transistor 46. A gate of transistor 46 is connected to the control signal 23 of FIG. 1 that uses the Power Domain 2. The control signal 23 is the control signal used to control the master oscillator 18 through the master oscillator control 20 when the supply voltage for Power Domain 2 is sufficiently high for reliable operation. The control signal 23 is also connected to an input of an inverter 52 that is powered by the Logic Power Domain or Power Domain 2. An output of inverter 52 is connected to a gate of an N-channel transistor 50. A source of each of transistor 46 and transistor 50 is connected to a terminal for receiving a ground reference. A P-channel transistor 48 has a source connected to the source of transistor 44 for receiving the Power Domain 1 voltage. A gate of transistor 48 is connected to node 47. A gate of transistor 44 is connected to a node 49 and to a drain of transistor 50. It should be noted that level shifter circuit 40 is powered by both the first and the second power domains.

Level shifter circuit 42 has a resistor 60 having a first terminal connected to a terminal for receiving the Power Domain 1 voltage. A second terminal of resistor 60 is connected to a source of a P-channel transistor 62. A gate of transistor 62 is connected to a drain thereof at a node 63. An N-channel transistor 64 has a drain connected to the drain of transistor 62 at node 63. A gate of transistor 64 is connected to the Low Voltage Indicator signal 26 from the power domain 2 low voltage indicator 24. A P-channel transistor 66 has a source connected to the terminal for receiving the Power Domain 1 voltage. A drain of transistor 66 is connected at a node 68 to a drain of an N-channel transistor 70. A gate of transistor 70 is connected to the gate of transistor 64 and to the Low Voltage Indicator signal 26 from the power domain 2 low voltage indicator 24. A source of each of transistor 64 and transistor 70 is connected to a ground reference voltage terminal. A P-channel transistor 72 has a source connected to the terminal for receiving the Power Domain 1 voltage. A gate of transistor 72 is connected to the node 68. A gate of transistor 66 is connected to a node 74 which is connected to the drain of transistor 72. A drain of an N-channel transistor 76 is connected to node 74. A gate of transistor 76 is connected to node 63, and a source of transistor 76 is connected to the ground reference voltage terminal. A P-channel transistor 80 has a source connected to the terminal for receiving the Power Domain 1 voltage. A gate of transistor 80 is connected to a gate of an N-channel transistor 82 at node 74. A drain of transistor 80 is connected to a drain of transistor 82 at a node 83. A source of transistor 82 is connected to the ground reference voltage terminal. A P-channel transistor 84 has a source connected to the terminal for receiving the Power Domain 1 voltage. A gate of transistor 84 is connected to a gate of an N-channel transistor 86 at node 83. A drain of transistor 84 is connected to a drain of transistor 86 and provides the Power Domain 1 Inhibit signal. A source of transistor 86 is connected to the ground reference voltage terminal.

A first input of an AND gate 53 is connected to node 49. A second input of AND gate 53 is connected to node 74. An output 54 of AND gate 53 is connected to an input of a master oscillator 18. The master oscillator 18 is powered by the Power Domain 1 as was illustrated in FIG. 1. Master oscillator 18 has multiple outputs that are respectively coupled to an input of a predetermined one of the multiple charge pumps 16. The multiple charge pumps 16 include a first charge pump 90, a second charge pump 91 and additional charge pumps such as an Nth charge pump 92 where N is an integer. Each of charge pumps 90-92 has a respective output that is coupled to the array control logic 14.

In operation, the level shifter circuit 40 receives a digital signal while being powered by the Power Domain 2 and provides an output bit at node 49 that has a value which is the same digital value (i.e. logic state) as control signal 23. However, the voltage level of the output of level shifter circuit 40 is translated from the lower Power Domain 2 to the higher Power Domain 1. Within level shifter circuit 42, the signal 78 also has the same logic value as the power domain 2 low voltage indicator 24. As with level shifter circuit 40, the voltage level of the output of level shifter circuit 42 is translated from the lower Power Domain 2 to the higher Power Domain 1. However, all of the circuitry within level shifter circuit 42 is powered by the Power Domain 1. Therefore, the output of level shifter circuit 42 will be accurate whereas the output of level shifter circuit 40 may not be accurate when the voltage associated with Power Domain 2 drops below a threshold level. Unless both the output of the level shifter circuit 40 and the level shifter circuit 42 are enabled, the AND gate 53, which is powered by the higher Power Domain 1 supply voltage, will not enable the master oscillator 18. Thus it should be understood that the level shifter circuit 42 functions to guarantee that the Master Oscillator is not enabled when the Low Voltage Indicator signal 26 is asserted.

Figure 3:
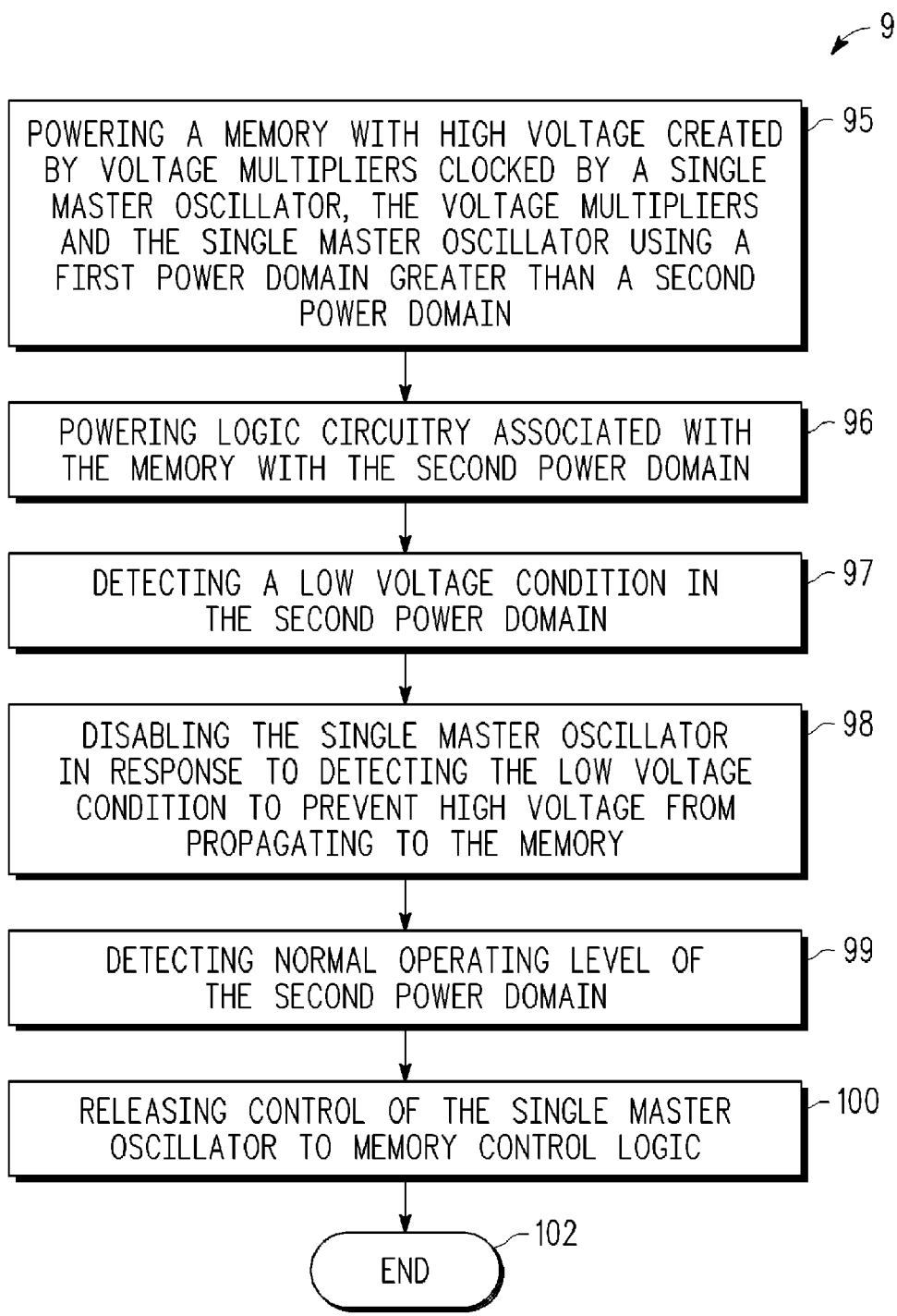
FIG. 3 illustrates in a flow chart a method for preventing high voltage memory disturb in a memory in accordance with the present invention.

Illustrated in FIG. 3 is a flowchart of a method 94 for preventing high voltage memory disturb. In a step 95 a memory is powered with high voltage that is created by voltage multipliers clocked by a single master oscillator. In this context the term "high voltage" is relative and means a voltage which is higher in value than the voltage used to power transistors connected to implement logic functions. Such high voltage is typically required to operate memories, such as FLASH memory, for programming and erasing operations. The voltage multipliers and the single master oscillator use a first power domain greater in voltage magnitude than a second power domain. In a step 96 the logic circuitry associated with the memory is powered with the second power domain. In a step 97 a low voltage condition in the second power domain is detected. This condition occurs when the second power domain voltage drops below a predetermined threshold value. In a step 98 the single master oscillator 18 is disabled in response to detecting the low voltage condition in the second power domain. Disabling the master oscillator 18 prevents high voltage from propagating to the memory array 12. In a step 99 the return of the second power domain to a normal operating level is detected. This detection occurs when the second power domain voltage reaches or exceeds the predetermined threshold value for a predetermined amount of time. In a step 100 control of the single master oscillator 18 is released or given back to the memory control logic 22. In a step 102 the method 94 is concluded when memory control logic 22 is controlling the memory 10 indicating that the Power Domain 2 has adequate magnitude to provide accurate and reliable operation.

Figure 4:
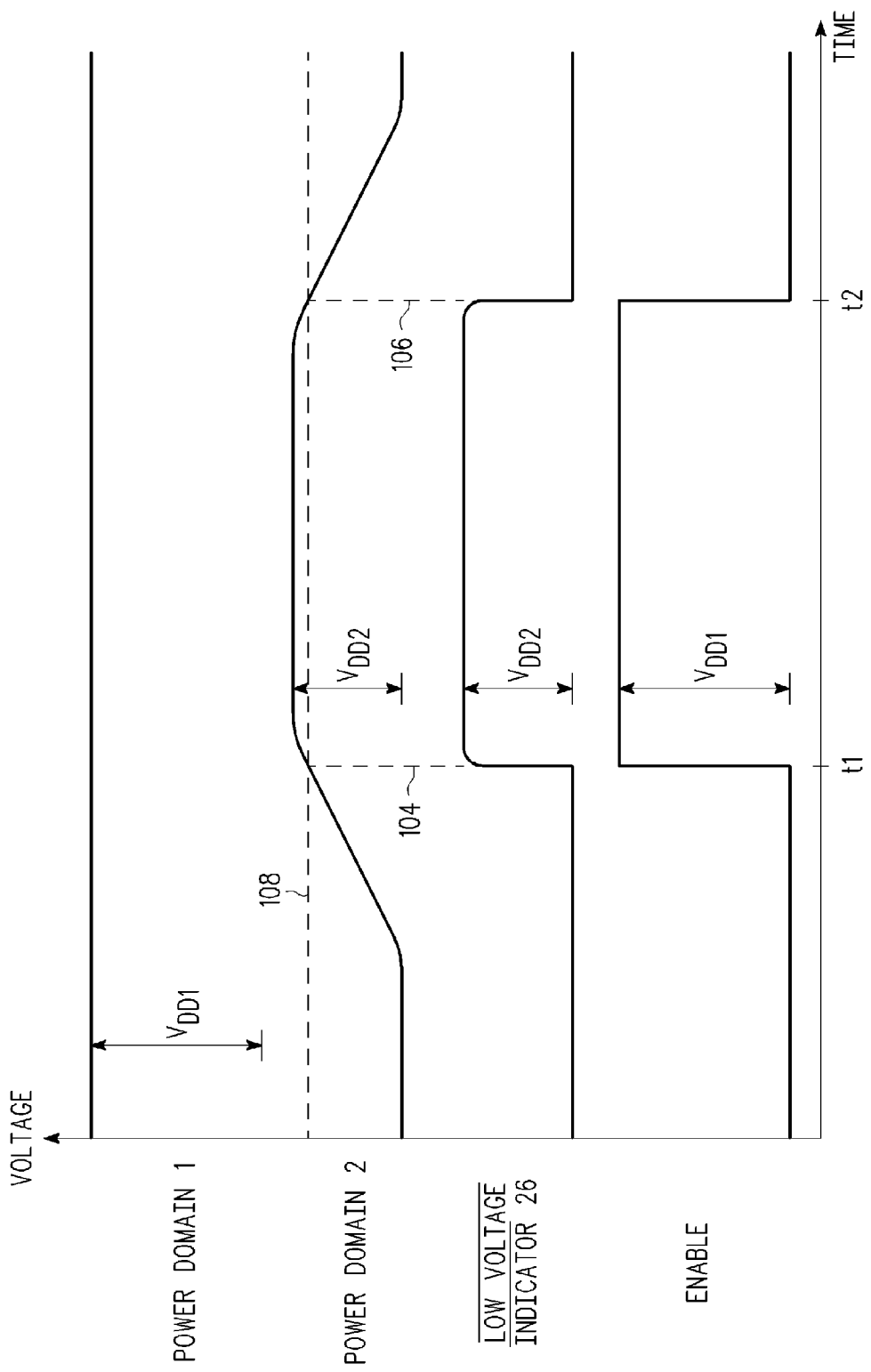
FIG. 4 illustrates in a timing diagram a variety of voltage signals associated with the memory of FIG. 1.

Illustrated in FIG. 4 are waveforms that plot voltage versus time for various signals that have been discussed above in connection with FIGS. 1 and 2. The Power Domain 1 signal is illustrated as having a constant value, $V_{DD1}$, over the entire illustrated time. The Power Domain 2 signal is illustrated as varying between zero and $V_{DD2}$. Prior to time t1, the voltage $V_{DD2}$ of Power Domain 2 is below a predetermined value 108. Therefore, the Low Voltage indicator signal, illustrated as an active low signal, is asserted. When a low voltage condition exists, the master oscillator 18 is disabled as indicated by the Enable signal being a logic zero. At time t1 the predetermined value 108 is exceeded by the Power Domain 2 value and becomes the supply voltage value of $V_{DD2}$ until approximately time t2. During this interval of time the Low Voltage Indicator signal 26 is not asserted as indicated by the active low instantiation assuming a value of $V_{DD2}$. During this time interval of adequate Power Domain 2 voltage for reliable operation the master oscillator 18 is enabled with a $V_{DD1}$ signal. After time t2 the predetermined value 108 is not met by the Power Domain 2 voltage and the Low Voltage Indicator signal 26 is again asserted. Additionally, the enable signal for the master oscillator 18 is not asserted and the clock from the master oscillator 18 to the multiple charge pumps 16 is not provided. These waveforms indicate a seamless operation as the voltage of Power Domain 2 varies above and below the predetermined value 108. Voltage variation is not permitted to disturb the electrical characteristics that have been programmed into the bit cells of memory array 12.

By now it should be appreciated that there has been provided a method and memory circuit which minimizes bit cell disturb caused by one of multiple power supply voltages used in a memory becoming too low to ensure reliable operation. As non-volatile memory bitcells continue to be implemented with smaller dimensions, the bitcells exhibit a greater susceptibility to voltage disturbance or memory disturbs which result in incorrect stored bit cells. In one form a power on reset signal that is active when there is an invalid logic level signal is used for an additional function. The power on reset signal having a voltage level that is at a logic voltage level is converted to a higher voltage level and is used as an enable signal to disable multiple charge pumps in a memory system. The multiple charge pumps are disabled by disabling a master or common oscillator that controls the multiple charge pumps. When the master oscillator in the system is not functioning it can be guaranteed that the higher voltage of power domain 2 will not result in a bit disturb in the memory array. Because the operation of the multiple charge pumps is selectively disabled when the voltage of the power domain 1 falls below a threshold value, a drain current in the circuitry of the array control logic is avoided which eliminates the possibility of soft hot carrier injection (HCI) disturbs to the memory array. The methods described herein effectively avoid bit disturb in a nonvolatile memory array for internally generated voltages created by voltage multipliers or charge pumps.

In one form there is herein provided a method of operating a circuit having a memory array. Memory control logic is operated using a logic power domain. Higher voltages than that of the logic power domain are generated in response to an oscillator oscillating. The higher voltages are used to operate the memory array. Operation of the oscillator is controlled with the memory control logic when the logic power domain is at least at a first level. The oscillator is disabled when the logic power domain is below the first level. In another form generating the high voltages further includes using voltage multipliers that are responsive to the oscillator oscillating. In another form generating the voltages further includes powering the voltage multipliers with a memory power domain that is lower than the higher voltages. In yet another form using the higher voltages further includes using array control logic for applying the higher voltages to the memory array. In another form using the higher voltages further includes powering the array control logic with the memory power domain. In yet another form disabling the oscillator further includes asserting a low voltage indicator signal in response to the logic power domain dropping below the first level. The oscillator is disabled in response to the step of asserting the low voltage indicator signal. In another form controlling the operation of the oscillator further includes using the memory control logic to assert an oscillator enable signal to an oscillator control circuit. An output of the oscillator control circuit is coupled to the oscillator at a first logic state for enabling the oscillator. In yet another form asserting the low voltage indicator signal further includes asserting the low voltage indicator signal at a logic state that forces the oscillator control circuit to provide the output of the oscillator control circuit to the oscillator at a second logic state which disables the oscillator. In yet another form asserting the low voltage indicator signal further includes level-shifting the low voltage indicator signal. The level-shifted low voltage indicator signal is provided to a logic gate. An output of the logic gate is coupled to the oscillator.

In another form a circuit includes a memory control logic powered by a logic power domain having a first output and a second output. A low voltage indicator circuit is coupled to the logic power domain having an output. An oscillator control circuit has a first input coupled to the output of the low voltage indicator circuit, a second input coupled to the first output of the memory control logic, and an output. An oscillator has a control input coupled to the output of the oscillator control circuit and an oscillator output. A plurality of voltage multipliers is coupled to the output of the oscillator and provides high voltages having a higher absolute level than the logic power domain. An array control logic is coupled to the plurality of voltage multipliers and the second output of the memory control logic. A memory array is coupled to the array control logic. In another form the oscillator control circuit is powered by a memory power domain having a level higher than the logic power domain and lower than the absolute value of the high voltages. In another form the oscillator control circuit includes a first level shifter having an input coupled to the first output of the memory control logic and an output. A second level shifter has an input coupled to the output of the low voltage indicator circuit and an output. A logic gate has an input coupled to the output of the first level shifter, a second input coupled to the output of the second level shifter, and an output coupled to the control input of the oscillator. In one form the second level shifter includes a transistor having a gate coupled to the output of the low voltage indicator circuit, a source coupled to a ground terminal, and a drain. A resistive element and a diode-connected transistor are connected in series between the drain of the transistor and the memory power domain. A level-shifting circuit, powered by the memory power domain, has a first input coupled to the output of the low voltage indicator circuit, a second input coupled to the drain of the first transistor, and an output as the output of the second level shifter. The low voltage indicator circuit provides the output of the low voltage indicator circuit at a logic low when the logic power domain is below a predetermined voltage level. The array control logic includes circuitry for controlling the application of the higher voltages to the memory array responsive to the second output of the memory control logic, wherein the second output of the memory control logic is multi-signal. In another form the memory array includes non-volatile memory cells that require the higher voltages for programming and erasing. The array control logic controls the programming and erasing using the higher voltages. The array control logic uses the second power domain and the first power domain. The low voltage indicator circuit causes the oscillator control circuit to disable the oscillator when the logic power domain is below a predetermined voltage level.

In another form there is herein provided a circuit having a memory array of cells requiring high voltages for programming and erasing. Memory control circuitry provides signals instructing performance of reading, programming, and erasing operations and being powered by a logic power domain. A low voltage indicator indicates when the logic power domain is below a predetermined level. An oscillator is powered by at least a memory power domain. An oscillator control circuit disables the oscillator when the low voltage indicator indicates that the logic power domain is below the predetermined level and allows the memory control circuitry to control the oscillator when the logic power domain is at or above the predetermined level. A plurality of voltage multipliers is coupled to the output of the oscillator, wherein the voltage multipliers are powered at least by the memory power domain and provide high voltages having a higher level than the memory power domain. Array control circuitry is coupled to the plurality of voltage multipliers and the memory control circuitry for applying the high voltages to the memory array in performing programming and erasing according to the performance instructed by the memory control circuitry. The memory control circuitry controls the plurality of voltage multipliers. In one form the oscillator control circuitry includes a first level shifter coupled to the low voltage indicator. A second level shifter is coupled to the memory control circuitry. A logic gate is coupled to the first level shifter, the second level shifter, and the oscillator.

Although the invention has been described with respect to specific conductivity types or polarity of potentials, it should be understood that conductivity types and polarities of potentials may be reversed. Moreover, any terms such as "front," "back," "top," "bottom," "over," "under", "above", "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Although the invention is described herein with reference to specific embodiments, various modifications and changes can be made without departing from the scope of the present invention as set forth in the claims below. For example, the method may be used to form other semiconductor devices in addition to transistors. For example diodes and fuses may be implemented using this method. Also, various semiconductor materials may be used in addition to the materials specifically listed herein. Multiple memory arrays may be implemented with each array being controlled by multiple charge pumps that are clocked by a common oscillator. Additionally, groupings of multiple charge pumps may be implemented wherein each grouping is controlled by a single or master oscillator. Any benefits, advantages, or solutions to problems that are described herein with regard to specific embodiments are not intended to be construed as a critical, required, or essential feature or element of any or all the claims. Accordingly, the specification and figures are to be regarded in an illustrative rather than a restrictive sense, and all such modifications are intended to be included within the scope of the present invention.

What is claimed is:

1. A method of operating a circuit having a memory array, comprising:
   operating memory control logic using a logic power domain;
   generating higher voltages than that of the logic power domain in response to an oscillator oscillating;
   using the higher voltages to operate the memory array;
   controlling operation of the oscillator with the memory control logic when the logic power domain is at least at a first level;
   asserting a low voltage indicator signal in response to the logic power domain dropping below the first level; and
   disabling the oscillator in response to the step of asserting the low voltage indicator signal.

2. The method of claim 1, wherein generating higher voltages is further characterized by using voltage multipliers that are responsive to the oscillator oscillating.

3. The method of claim 2, wherein generating higher voltages is further characterized as powering the voltage multipliers with a memory power domain that is lower than the higher voltages.

4. The method of claim 1, wherein using the higher voltages is further characterized as using array control logic for applying the higher voltages to the memory array.

5. The method of claim 4, wherein using the higher voltages is further characterized as powering the array control logic with a memory power domain.

6. The method of claim 1, wherein the first level of the logic power domain is selected as a voltage to permit logic circuitry of the memory control logic to reliably operate.

7. The method of claim 6, wherein controlling the operation of the oscillator is further characterized by:
   using the memory control logic to assert an oscillator enable signal to an oscillator control circuit; and
   coupling an output of the oscillator control circuit to the oscillator at a first logic state for enabling the oscillator.

8. The method of claim 7, wherein asserting the low voltage indicator signal is further characterized as asserting the low voltage indicator signal at a logic state that forces the oscillator control circuit to provide the output of the oscillator control circuit to the oscillator at a second logic state which disables the oscillator.

9. The method of claim 8, wherein the step of asserting the low voltage indicator signal is further characterized by:
   level-shifting the low voltage indicator signal to provide a level-shifted low voltage indicator signal;
   providing the level-shifted low voltage indicator signal to a logic gate; and
   coupling an output of the logic gate to the oscillator.

10. A circuit, comprising:
    memory control logic powered by a logic power domain having a first output and a second output;
    a low voltage indicator circuit coupled to the logic power domain having an output;
    an oscillator control circuit having a first input coupled to the output of the low voltage indicator circuit, a second input coupled to the first output of the memory control logic, and an output;
    an oscillator having a control input coupled to the output of the oscillator control circuit and an oscillator output;
    a plurality of voltage multipliers coupled to the output of the oscillator, the plurality of voltage multipliers providing high voltages having a higher absolute value than the logic power domain;
    array control logic coupled to the plurality of voltage multipliers and the second output of the memory control logic; and
    a memory array coupled to the array control logic.

11. The circuit of claim 10, wherein the oscillator control circuit is powered by a memory power domain having a value higher than the logic power domain and lower than absolute values of the high voltages.

12. The circuit of claim 11, wherein the oscillator control circuit comprises:
    a first level shifter having an input coupled to the first output of the memory control logic and an output;
    a second level shifter having an input coupled to the output of the low voltage indicator circuit and an output; and
    a logic gate having an input coupled to the output of the first level shifter, a second input coupled to the output of the second level shifter, and an output coupled to the control input of the oscillator.

13. The circuit of claim 12, wherein the second level shifter comprises:
    a transistor having a gate coupled to the output of the low voltage indicator circuit, a source coupled to a ground terminal, and a drain;
    a resistive element and a diode-connected transistor coupled in series between the drain of the transistor and the memory power domain; and
    level-shifting means, powered by the memory power domain, having a first input coupled to the output of the low voltage indicator circuit, a second input coupled to the drain of the transistor, and an output as the output of the second level shifter.

14. The circuit of claim 13, wherein the low voltage indicator circuit provides the output of the low voltage indicator circuit at a logic low when the logic power domain is below a predetermined voltage level.

15. The circuit of claim 10, wherein the array control logic comprises means for controlling application of the high voltages to the memory array responsive to the second output of the memory control logic, wherein the second output of the memory control logic is multi-signal.

16. The circuit of claim 14, wherein:
    the memory array comprises non-volatile memory cells requiring the high voltages for programming and erasing;
    the array control logic controls the programming and erasing using the high voltages; and
    the array control logic uses the logic power domain and the memory power domain.

17. The circuit of claim 10, wherein the low voltage indicator circuit causes the oscillator control circuit to disable the oscillator when the logic power domain is below a predetermined voltage level.

18. A circuit, comprising:
    a memory array comprised of cells requiring high voltages for programming and erasing;
    memory control means for providing signals instructing performance of reading, programming, and erasing operations and being powered by a logic power domain;
    a low voltage indicator for indicating when the logic power domain is below a predetermined level;
    an oscillator comprising an output and being powered by at least a memory power domain;

oscillator control means for disabling the oscillator when the low voltage indicator indicates that the logic power domain is below the predetermined level and allowing the memory control means to control the oscillator when the logic power domain is at or above the predetermined level, the oscillator control means further comprising a first level shifter coupled to the low voltage indicator, a second level shifter coupled to the memory control means, and a logic gate coupled to the first level shifter, the second level shifter, and the oscillator;

a plurality of voltage multipliers coupled to the output of the oscillator, wherein the plurality of voltage multipliers is powered at least by the memory power domain and provides high voltages having a higher value than the memory power domain; and array control means, coupled to the plurality of voltage multipliers and the memory control means, for applying the high voltages to the memory array in performing programming and erasing according to the performance instructed by the memory control means.

19. The circuit of claim 18, wherein the memory control means controls the plurality of voltage multipliers.

20. The circuit of claim 18, wherein the logic gate further comprises an AND gate powered by the memory power domain.

* * * * *